United States Patent
Fine et al.

(10) Patent No.: US 7,729,891 B2
(45) Date of Patent: Jun. 1, 2010

(54) PROBABILISTIC REGRESSION SUITES FOR FUNCTIONAL VERIFICATION

(75) Inventors: Shai Fine, Ra'anana (IL); Shmuel Ur, Shorashim (IL); Avi Ziv, Haifa (IL); Simon Rushton, Winchester (GB)

(73) Assignee: International Business Machines Corporation, Armonk, NY (US)

( * ) Notice: Subject to any disclaimer, the term of this patent is extended or adjusted under 35 U.S.C. 154(b) by 760 days.

(21) Appl. No.: 11/145,866

(22) Filed: Jun. 6, 2005

(65) Prior Publication Data
US 2007/0010975 A1 Jan. 11, 2007

(30) Foreign Application Priority Data
Jun. 5, 2004 (GB) ................................. 0412611.6

(51) Int. Cl.
*G06F 17/00* (2006.01)
*G06F 17/50* (2006.01)
*G06F 11/00* (2006.01)

(52) U.S. Cl. .................... 703/2; 716/2; 716/4; 716/5; 714/25; 714/37; 714/38; 714/100; 714/738; 714/742

(58) Field of Classification Search .................. 703/1, 703/2; 716/4, 5, 2; 714/30, 33, 37, 38, 25, 714/32, 100, 738, 742
See application file for complete search history.

(56) References Cited

U.S. PATENT DOCUMENTS

| | | | | |
|---|---|---|---|---|
| 5,694,540 A | * | 12/1997 | Humelsine et al. ............. 714/38 |
| 5,724,504 A | * | 3/1998 | Aharon et al. ................. 714/33 |
| 5,805,795 A | * | 9/1998 | Whitten ........................ 714/38 |
| 5,831,998 A | * | 11/1998 | Ozmizrak .................... 714/741 |
| 5,922,079 A | * | 7/1999 | Booth et al. .................. 714/26 |
| 6,061,643 A | * | 5/2000 | Walker et al. ................. 702/123 |
| 6,212,667 B1 | * | 4/2001 | Geer et al. ..................... 716/6 |
| 6,269,457 B1 | * | 7/2001 | Lane ........................... 714/38 |
| 6,272,449 B1 | * | 8/2001 | Passera .......................... 703/2 |
| 6,298,317 B1 | * | 10/2001 | Wiemann ..................... 703/22 |
| 6,351,826 B1 | * | 2/2002 | Kato ............................ 714/38 |
| 6,356,858 B1 | * | 3/2002 | Malka et al. ................ 702/186 |
| 6,385,607 B1 | * | 5/2002 | Iyengar ......................... 707/5 |

(Continued)

OTHER PUBLICATIONS

Shai Fine, and Avi Ziv, "Enhancing the Control and Efficiency of the Covering Process" IEEE International High Level Design Validation and Test Workshop (HLDVT), pp. 96-101, 2003.*

(Continued)

*Primary Examiner*—Hugh Jones
*Assistant Examiner*—Kibrom Gebresilassie
(74) *Attorney, Agent, or Firm*—Michael J. Buchenhorner; Vazken Alexanian

(57) ABSTRACT

Methods, apparatus and systems are provided that enable the generation of random regression suites for verification of a hardware or software design to be formulated as optimization problems. Solution of the optimization problems using probabilistic methods provides information on which set of test specifications should be used, and how many tests should be generated from each specification. In one mode of operation regression suites are constructed that use the minimal number of tests required to achieve a specific coverage goal. In another mode of operation regression suites are constructed so as to maximize task coverage when a fixed number of tests are run or within a fixed cost.

18 Claims, 12 Drawing Sheets

U.S. PATENT DOCUMENTS

| | | | | |
|---|---|---|---|---|
| 6,415,396 | B1* | 7/2002 | Singh et al. | 714/38 |
| 6,490,696 | B1* | 12/2002 | Wood et al. | 714/38 |
| 6,523,151 | B2* | 2/2003 | Hekmatpour | 716/4 |
| 6,606,735 | B1* | 8/2003 | Richardson et al. | 716/5 |
| 6,647,513 | B1* | 11/2003 | Hekmatpour | 714/37 |
| 6,968,286 | B1* | 11/2005 | Watkins | 702/124 |
| 6,986,130 | B1* | 1/2006 | Boucher | 717/151 |
| 7,133,816 | B2* | 11/2006 | Adir et al. | 703/14 |
| 7,181,376 | B2* | 2/2007 | Fine et al. | 703/2 |
| 7,278,056 | B2* | 10/2007 | Hekmatpour | 714/37 |
| 7,320,090 | B2* | 1/2008 | Coulter et al. | 714/30 |
| 7,434,184 | B2* | 10/2008 | Li | 716/5 |
| 7,454,324 | B1* | 11/2008 | Seawright et al. | 703/14 |
| 2002/0002698 | A1* | 1/2002 | Hekmatpour | 716/4 |
| 2003/0061581 | A1* | 3/2003 | Baumgartner et al. | 716/4 |
| 2003/0196191 | A1* | 10/2003 | Hartman et al. | 717/126 |
| 2004/0154001 | A1* | 8/2004 | Haghighat et al. | 717/130 |
| 2005/0096861 | A1* | 5/2005 | Ur et al. | 702/109 |
| 2005/0278576 | A1* | 12/2005 | Hekmatpour | 714/37 |
| 2008/0255813 | A1* | 10/2008 | Fine et al. | 703/2 |

OTHER PUBLICATIONS

Shai Fine, Shmuel Ur, Avi Ziv, "Probabilistic Regression Suites for Functional Verification," dac, pp. 49-54, Design Automation Conference, 41st Conference on (DAC'04), 2004.*

A. Hekmatpour, J. Coulter, "Coverage-Directed Management and Optimization of Random Functional Verification," Proc. of International Test Conference, Charlotte NC, pp. 148-155, Sep. 2003.*

S. Fine, A. Ziv, "Coverage Directed Test Generation for Functional Verification using Bayesian Networks", Jun. 2-6, 2003, pp. 286-291, ACM.*

Aug. 28, 2008-Probabilistic_Alternative.pdf.

Aug. 28, 2008-Probabilistic-Regression.pdf.

* cited by examiner

FIG. 7

| | PHASE 1 | PHASE 2 | PHASE 3 | PHASE 4 |
|---|---|---|---|---|
| TEST GROUP 1 | MACHINE POOL 1<br>JSVT001<br>JSVT002 | MACHINE POOL 2<br>JSVT003<br>JSVT004 | MACHINE POOL 3<br>JSVT005<br>JSVT006 | MACHINE POOL 4<br>JSVT007<br>JSVT008 |
| TEST GROUP 2 | MACHINE POOL 2<br>JSVT003<br>JSVT004 | MACHINE POOL 3<br>JSVT005<br>JSVT006 | MACHINE POOL 4<br>JSVT007<br>JSVT008 | MACHINE POOL 1<br>JSVT001<br>JSVT002 |
| TEST GROUP 3 | MACHINE POOL 3<br>JSVT005<br>JSVT006 | MACHINE POOL 4<br>JSVT007<br>JSVT008 | MACHINE POOL 1<br>JSVT001<br>JSVT002 | MACHINE POOL 2<br>JSVT003<br>JSVT004 |
| TEST GROUP 4 | MACHINE POOL 4<br>JSVT007<br>JSVT008 | MACHINE POOL 1<br>JSVT001<br>JSVT002 | MACHINE POOL 2<br>JSVT003<br>JSVT004 | MACHINE POOL 3<br>JSVT005<br>JSVT006 |
| | 0 WKS    4 WKS | 7 WKS | 10 WKS | 12 WKS |

FIG. 8

MACHINE TABLE

| PLATFORM | MACHINE NAME | PARTITION | INSTALLED OS | INSTALLED NATIONAL LANGUAGE | USE FOR ALLOCATING TESTS? | MODEL TYPE | VARL NUMBER | SERIAL NUMBER | CURRENT LOCATION | IP ADDRESS | TYPE OF CPU |
|---|---|---|---|---|---|---|---|---|---|---|---|
| LINUX IA32 | N/A | N/A | N/A | | | | | | | | |
| | JSVT001 | JSVT001-1 | SLES8 | | | INTELLISTATION E PRO | 306836-36G | 550174K | C030 | 9.20.178.25 | 933 MHz PENTIUM |
| | JSVT002 | JSVT002-1 | SLES8 | | | INTELLISTATION M PRO | 206868-6BG | 5591K94 | C030 | 9.20.178.29 | 933 MHz PENTIUM |
| | | JSVT002-2 | RHAS | | | | | | | | |
| | | JSVT002-3 | TLBS | | | | | | | | |
| | JSVT003 | JSVT003-1 | SLES8 | | | INTELLISTATION E PRO | 306836-36G | 550174L | C030 | 9.20.178.26 | 933 MHz PENTIUM |
| | | JSVT003-2 | RHAS | | | | | | | | |
| | | JSVT003-3 | TLBS | | | | | | | | |
| | JSVT007 | JSVT007-1 | RH73 | | N | INTELLISTATION M PRO | 206868-6BG | 550174L | C030 | 9.20.178.31 | 933 MHz PENTIUM |
| | | JSVT007-2 | SUSE80 | | N | | | | | | |
| | | JSVT007-3 | SLES8 | | | | | | | | |
| | | JSVT007-4 | TLBS | | | | | | | | |
| | | JSVT007-5 | RHAS | | | | | | | | |

FIG. 9

| PHASE | TEST AREA | TEST CASE | TESTER | MACHINE | PARTITION | LANGUAGE | JIT ON | JIT OFF | GC1 | GC2 | QUICKSTART | STATUS |
|---|---|---|---|---|---|---|---|---|---|---|---|---|
| PHASE 1 | INSTALLATION/MIGRATION | DOCUMENTATION | PETER | N/A | N/A | N/A | N/A | N/A | N/A | N/A | N/A | |
| PHASE 2 | INSTALLATION/MIGRATION | DOCUMENTATION | PETER | N/A | N/A | N/A | N/A | N/A | N/A | N/A | N/A | |
| PHASE 3 | INSTALLATION/MIGRATION | DOCUMENTATION | PETER | N/A | N/A | N/A | N/A | N/A | N/A | N/A | N/A | |
| PHASE 4 | INSTALLATION/MIGRATION | DOCUMENTATION | PETER | N/A | N/A | N/A | N/A | N/A | N/A | N/A | N/A | |
| FINAL REGRESSION TEST | INSTALLATION/MIGRATION | DOCUMENTATION | PETER | N/A | N/A | N/A | N/A | N/A | N/A | N/A | N/A | |

FIG. 10

| PHASE | TEST AREA | TEST CASE | TESTER | MACHINE | PARTITION | LANGUAGE | JIT ON | JIT OFF | GC1 | GC2 | QUICKSTART | STATUS |
|---|---|---|---|---|---|---|---|---|---|---|---|---|
| PHASE 1 | USER INTERFACES/MULTI MEDIA | ACCESS | CAROLINE | JSVT004 | JSVT004-1 | EN | | | | | N/A | N/A |
| PHASE 1 | ORB | INS | GEORGE | JSVT025 | JSVT025-1 | EN | | | | | N/A | N/A |
| PHASE 1 | ORB | PI | GEORGE | JSVT025 | JSVT025-1 | EN | | | | | N/A | N/A |
| PHASE 1 | ORB | POA | GEORGE | JSVT025 | JSVT025-1 | EN | | | | | N/A | N/A |
| PHASE 1 | ORB | TYPES | GEORGE | JSVT025 | JSVT025-1 | EN | | | | | N/A | N/A |
| PHASE 1 | USER INTERFACES/MULTI MEDIA | JVIJCX1 | CAROLINE | JSVT025 | JSVT025-1 | EN | | | | | N/A | N/A |
| PHASE 1 | ORB | POA | GEORGE | JSVT032 | JSVT032-1 | CN | N/A | | | | N/A | N/A |
| PHASE 1 | INSTALLATION/MIGRATION | DEMO | PETER | JSVT079 | JSVT079-1 | TU | | N/A | N/A | N/A | N/A | |
| PHASE 2 | USER INTERFACES/MULTI MEDIA | ACCESS | CAROLINE | JSVT004 | JSVT004-1 | EN | | | | | N/A | N/A |
| PHASE 2 | APPLICATION/BENCHMARKS | JSTREET | JOHN | JSVT025 | JSVT025-1 | EN | | | | | N/A | N/A |
| PHASE 2 | INSTALLATION/MIGRATION | COEXISTENCE | PETER | JSVT079 | JSVT079-1 | TU | N/A | N/A | N/A | N/A | N/A | |
| PHASE 2 | INTERNET | HOD | DIANA | JSVT079 | JSVT079-1 | TU | N/A | N/A | N/A | N/A | N/A | |
| PHASE 3 | USER INTERFACES/MULTI MEDIA | ACCESS | CAROLINE | JSVT004 | JSVT004-1 | EN | | | | | N/A | N/A |
| PHASE 3 | USER INTERFACES/MULTI MEDIA | 2DDEMO | CAROLINE | JSVT079 | JSVT079-1 | TU | | | | | N/A | N/A |
| PHASE 4 | USER INTERFACES/MULTI MEDIA | ACCESS | CAROLINE | JSVT004 | JSVT004-1 | EN | | | | | N/A | N/A |
| PHASE 4 | ORB | INS | GEORGE | JSVT025 | JSVT025-1 | EN | | | | | N/A | N/A |
| PHASE 4 | ORB | PI | GEORGE | JSVT025 | JSVT025-1 | EN | | | | | N/A | N/A |
| PHASE 4 | ORB | TYPES | GEORGE | JSVT025 | JSVT025-1 | EN | | | | | N/A | N/A |

FIG. 11

| PHASE | TEST CASE | TESTER | MACHINE | PARTITION | OPERATING SYSTEM | LANGUAGE | JIT ON | JIT OFF | GC1 | GC2 | QUICKSTART | STATUS |
|---|---|---|---|---|---|---|---|---|---|---|---|---|
| PHASE 2 | BLUEJ | JOHN | JSVT089 | JSVT089-2 | RH71 | EN | | | | | N/A | N/A |
| PHASE 2 | JONATHAN | JOHN | JSVT089 | JSVT089-2 | RH71 | EN | | | | | N/A | N/A |
| PHASE 2 | JORAM | JOHN | JSVT089 | JSVT089-2 | RH71 | EN | | | | | N/A | N/A |
| PHASE 2 | JSTREET | JOHN | JSVT089 | JSVT089-2 | RH71 | EN | | | | | N/A | N/A |
| PHASE 2 | SPECJBB | JOHN | JSVT089 | JSVT089-2 | RH71 | EN | | | | | N/A | N/A |

FIG. 12

| PHASE | TEST AREA | TEST CASE | TESTER | MACHINE | PARTITION | LANGUAGE | JIT ON | JIT OFF | GC1 | GC2 | QUICKSTART | STATUS |
|---|---|---|---|---|---|---|---|---|---|---|---|---|
| PHASE 1 | ORB | INS | GEORGE | JSVT091-1 | SLES8-PPC | EN | | | | | N/A | N/A |
| PHASE 1 | ORB | PI | GEORGE | JSVT091-1 | SLES8-PPC | EN | | | | | N/A | N/A |
| PHASE 1 | ORB | POA | GEORGE | JSVT091-1 | SLES8-PPC | EN | | | | | N/A | N/A |
| PHASE 1 | USER INTERFACES/MULTI MEDIA | DRAGNDROP | CAROLINE | JSVT091-1 | SLES8-PPC | EN | | | | | N/A | N/A |
| PHASE 1 | USER INTERFACES/MULTI MEDIA | IMAGEIO | CAROLINE | JSVT091-1 | SLES8-PPC | EN | | | | | N/A | N/A |
| PHASE 1 | USER INTERFACES/MULTI MEDIA | JVICK1 | CAROLINE | JSVT091-1 | SLES8-PPC | EN | | | | | N/A | N/A |
| PHASE 1 | USER INTERFACES/MULTI MEDIA | JVICK1 | CAROLINE | JSVT091-1 | SLES8-PPC | EN | | | | | N/A | N/A |
| PHASE 1 | USER INTERFACES/MULTI MEDIA | SWING | CAROLINE | JSVT091-1 | SLES8-PPC | EN | | | | | N/A | N/A |
| PHASE 1 | USER INTERFACES/MULTI MEDIA | SWINGSET2 | CAROLINE | JSVT091-1 | SLES8-PPC | EN | | | | | N/A | N/A |
| PHASE 1 | USER INTERFACES/MULTI MEDIA | UIFOCUS | CAROLINE | JSVT091-1 | SLES8-PPC | EN | | | | | N/A | N/A |
| PHASE 1 | | JAVADL | GEORGE | JSVT091-3 | SLES7 | EN | | | | | N/A | N/A |
| PHASE 1 | ORB | ORBDEMOS | GEORGE | JSVT091-3 | SLES7 | EN | | | | | N/A | N/A |
| PHASE 1 | ORB | TYPES | GEORGE | JSVT091-3 | SLES7 | EN | | | | | N/A | N/A |
| PHASE 1 | USER INTERFACES/MULTI MEDIA | 2DDEMO | CAROLINE | JSVT091-1 | SLES8-PPC | EN | | | | | N/A | N/A |

PROBABILISTIC REGRESSION SUITES FOR FUNCTIONAL VERIFICATION

FIELD OF THE INVENTION

This invention relates to functional design verification. More particularly, this invention relates to the use of probabilistic methods for the creation of optimized regression test suites for functional design verification.

BACKGROUND OF THE INVENTION

Functional verification is widely acknowledged to be a bottleneck in the hardware design cycle. Indeed, up to 70% of design development time and resources are typically spent on functional verification. Allowing users to find design flaws, and fixing them in a subsequent release would be unwise and costly for three main reasons: (1) harm to reputation and brand-name; (2) a high cost of recall and replacement when there is a large installed base; and (3) litigation in the event that design flaws caused injury.

In current industrial practice, dynamic verification is the main functional verification technique for large and complex designs. Dynamic verification is accomplished by generating a large number of tests using random test generators, simulating the tests on the design-under-test, and checking that the design-under-test behaves according to its specification.

The rationale behind verification by simulation is that one acquires confidence in the correctness of a design-under-test by running a set of test cases that encompass a sufficiently large number of different cases, which in some sense is assumed to be a representative sample of the full space of possible cases. The ability of the design-under-test to correctly handle all cases is inferred from the correct handling of the cases actually tested. This approach is discussed, for example, in the document *User Defined Coverage—A Tool Supported Methodology for Design Verification*, Raanan Grinwald, Eran Harel, Michael Orgad, Shmuel Ur, and Avi Ziv, Proc. $38^{th}$ Design Automation Conference (DAC38), pages 158-163, 1998. When conducting simulations, it is desirable to define a particular subspace, which is considered to be "interesting" in terms of verification, and then to generate tests selected at random that cover the subspace.

Test cases developed by algorithms such as the foregoing are typically implemented on a test generator, which may optionally bias the tests based on internal testing knowledge. Such test generators are described in the following documents: *Model-Based Test Generation For Processor Design Verification*, Y. Lichtenstein, Y. Malka and A. Aharon, Innovative Applications of Artificial Intelligence (IAAI), AAAI Press, 1994; *Constraint Satisfaction for Test Program Generation*, L. Fournier, D. Lewin, M. Levinger, E. Roytman and Gil Shurek, Int. Phoenix Conference on Computers and Communications, March 1995; and *Test Program Generation for Functional Verification of PowerPC Processors in IBM*, A. Aharon, D. Goodman, M. Levinger, Y. Lichtenstein, Y. Malka, C. Metzger, M. Molcho and G. Shurek, $32^{nd}$ Design Automation Conference, San Francisco, June 1995, pp. 279-285.

The term coverage concerns checking and showing that testing has been thorough. Coverage is any metric of completeness with respect to a test selection criterion for the design-under-test. Simply stated, the idea is to create in some systematic fashion a large and comprehensive list of tasks, and check that in the testing phase each task was executed. A common coverage metric used in the industry is statement coverage, which is a metric of the number of source language statements executed under test. Coverage measurement tools for user-defined coverage models are disclosed in U.S. Pat. No. 6,356,858 to Malka et al., of common assignee herewith, and herein incorporated by reference.

One of the uses of coverage is to find good regression-suites. A regression test suite, referred to herein as a regression suite, is a group of tests, which are repeated on the design-under-test after a modification of the design-under-test, and is intended to show that the behavior of the design-under-test is unchanged except insofar as required by the current modification. To be effective, a regression suite must be sufficiently comprehensive so that it is likely to discover newly introduced design flaws, yet be compact, so that it can be economically repeated many times during the course of the development cycle.

Tests are included in regression suites for different reasons. For example, tests that previously led to the discovery of hard-to-find bugs are often included in regression suites. A complementary approach is to design regression suites so that they yield high coverage, i.e., regression suites that produce coverage at least as high as was thus far attained by the entire verification effort.

One approach for creating high-coverage regression suites is to find the smallest subset of the set of previously executed verification tests that yields comparable coverage. This is an instance of the set cover problem, which is known to be NP-Complete. However, an efficient and simple greedy algorithm can provide a good approximation of the optimal solution. An on-the-fly version of the algorithm produces good results for very large sets of tests, as described in the document, *Compacting Regression-Suites On-the-Fly*. E. Buchnik and S. Ur, in Proceedings of the $4^{th}$ Asia Pacific Software Engineering Conference, December 1997, which is herein incorporated by reference. Methods for producing compact regression suites are disclosed in the document, *On Minimizing Regression-Suites Using On-Line Set-Cover*, E. Buchnik and S. Ur, in Proceedings of Eurostar97: The Fifth European Conference on Software Testing, November 1997, which is herein incorporated by reference.

Regression suites that are built from a predetermined set of tests have several inherent problems. First, they are sensitive to changes in the design-under-test and its environment. Changes in the design may affect the behavior of the tests and affect areas of the test space that are not covered by the regression suite. In addition, tests that were previously used are less likely to find bugs than newer tests that have not-yet been included in the regression suite. Finally, the maintenance cost of such regression suites is high because every test has to be automated and maintained.

SUMMARY OF THE INVENTION

These problems are overcome using random regression suites in an environment where random based test generators are available. Methods and systems are disclosed in which the constitution of a random regression suite for verification of a hardware or software design is formulated as an optimization problem. Solution of the optimization problem using probabilistic methods provides information on which tests should be included in the suite, and how often the tests are to be run. The invention also provides methods for verifying a design, which is carried out by establishing a task-coverage repository.

According to other aspects of the method: the repository includes a plurality of instances of the tests, each of the instances having different parameters; and/or the repository includes test specifications; the optimized regression suite provides predetermined coverage of the tasks, and the subset of the repository has a minimal number of members; and/or the method of selecting a subset of the repository includes assigning an activation policy to elements of the subset of the repository; and/or the subset of the repository is selected using a greedy algorithm; and/or the subset of the repository is selected by relaxing a predetermined constraint; and/or the method includes establishing a task-coverage repository and probabilities are determined using coverage-directed test generation.

The invention provides a computer software product, including a computer-readable medium in which computer program instructions are stored, which instructions, when read by a computer, cause the computer to perform a method for verifying a design, which is carried out by establishing a task-coverage repository.

The invention provides a design verification system, including a memory having stored therein a description of identified tasks that are performed by a design and a task-coverage repository.

The invention provides a method for verifying a design, which is carried out by identifying tasks that are performed by the design, establishing a task-coverage repository.

The invention provides a design verification system, including a memory having stored therein a description of identified-tasks that are performed by a design and a task-coverage repository.

Advantages afforded by the invention include improved environment coverage, and improved detection of design flaws as the development cycle progresses. Further advantages include a reduction in the cost of the design verification process, and optimization of design verification across many environments. The approach reduces the amount of testing by up to 90%, or more, when compared with the repetitive execution of all tests in all environments.

BRIEF DESCRIPTION OF THE DRAWINGS

For a better understanding of the present invention, reference is made to the detailed description of the invention, by way of example, which is to be read in conjunction with the following drawings, wherein like elements are given like reference numerals, in which:

FIG. 7 is a table illustrating phasing and scheduling aspects of a testing project, which was conducted in accordance with a disclosed embodiment of the invention;

FIG. 8 is a table showing aspects of a model of a testing project indicating various tests, testing environments, and test ownership in accordance with a disclosed embodiment of the invention;

FIG. 9 is a table illustrating a representative setup sheet for use in a testing project, in accordance with a disclosed embodiment of the invention;

FIG. 10 is a table illustrating a representative portion of an operating system setup sheet of a testing project in accordance with a disclosed embodiment of the invention;

FIG. 11 is a table illustrating a representative portion of a test suite setup sheet of a testing project in accordance with a disclosed embodiment of the invention;

FIG. 12 is a table illustrating a representative portion of a machine setup sheet in accordance with a disclosed embodiment of the invention.

DETAILED DESCRIPTION OF THE INVENTION

Figure 1:
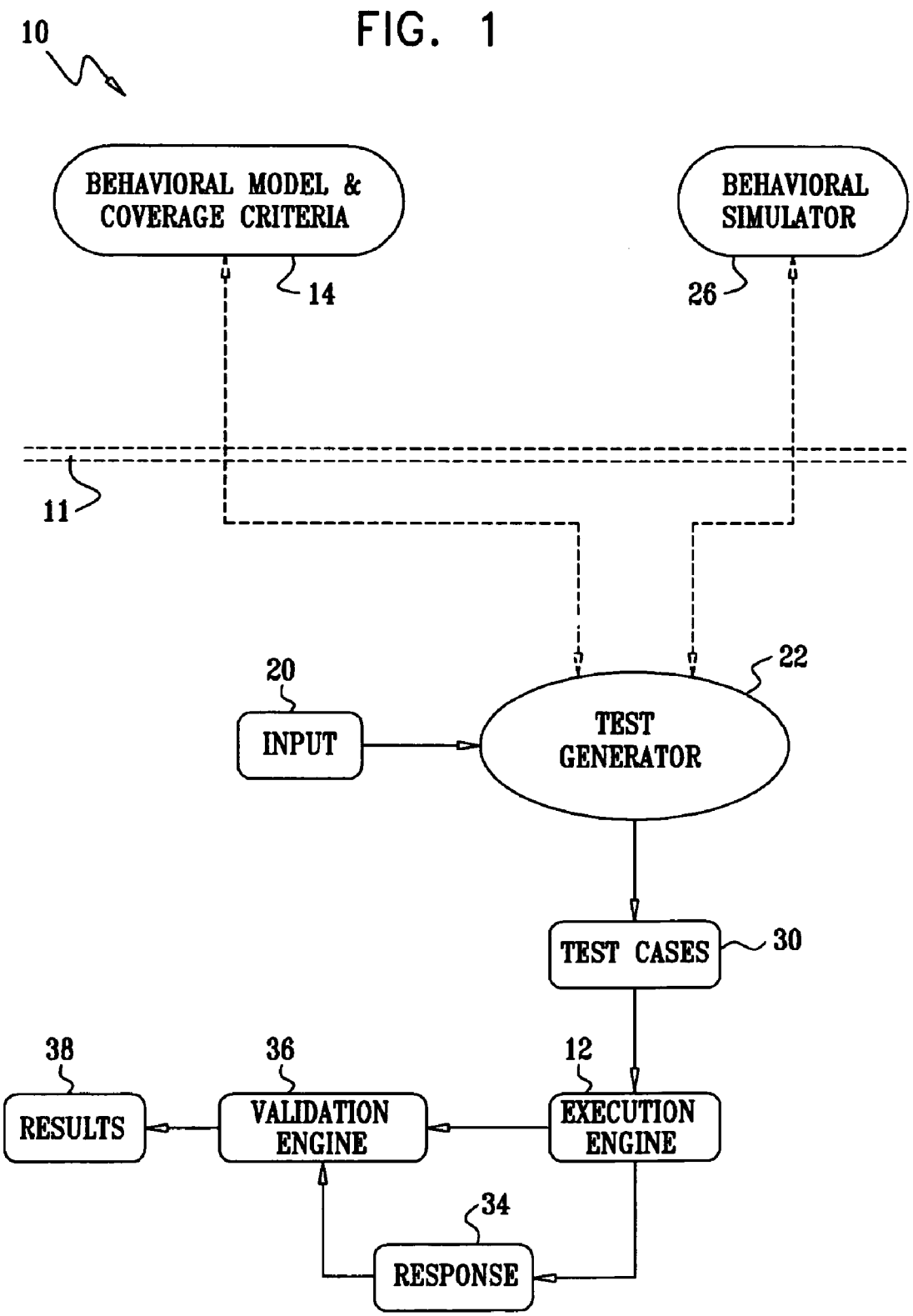
FIG. 1 is a block diagram of a verification system that is operable in accordance with a disclosed embodiment of the invention.

The present invention overcomes problems discussed above using random regression suites in an environment where random based test generators are available. A random regression suite is a suite of randomly generated tests that conform to a given set of test specifications. Typically, a random regression suite is produced by a random test generator. Repeating a random regression suite thus produces a different set of tests at each iteration. On stable designs, random regression suites generally result in lower coverage than do unvarying, fixed regression suites. On the other hand, random regression suites are less sensitive than fixed regression suites to changes in the design-under-test or its environment. Moreover, random regression suites do not have to be maintained. Therefore, cost savings are substantial. As a result, random regression suites are often preferred over fixed regression suites.

A conventional technique for creating random regression suites is to choose a few specifications of the design-under-test, and generate a number of tests from each specification on-the-fly. There is typically little guidance concerning which specifications to use, nor are there good criteria for the number of tests to be generated from each specification. Consequently, the quality of the regression tests generated by this method is haphazard.

The invention provides methods and systems in which the constitution of a random regression suite for verification of a hardware or software design is formulated as an optimization problem. Solution of the optimization problem using probabilistic methods provides information on which tests should be included in the suite, and how often the tests are to be run. The solution can also provide guidance as to which set of test specifications should be used, and how many tests should be generated from each specification. In one mode of operation, regression suites are constructed that use the minimal number of tests required to achieve a specific coverage goal. In another mode of operation, regression suites are constructed so as to maximize coverage when a fixed cost of operation is specified, such as a limit on the number of tests to be executed.

According to an example embodiment of the invention, random regression suites are efficiently created by exploiting the probability that each test specification covers given coverage tasks. This probability may be derived from previous executions of tests that were generated from the specification. Additionally or alternatively, a coverage-directed generation engine may provide probability estimates using Bayesian networks. Given a set of reliable probability estimates, the construction of efficient random regression suites is formalized as an optimization problem. The probability can be used to determine which tests or test specifications should be included in the regression suite, an activation policy, and how many tests should be generated from each specification.

The invention provides a method for verifying a design, which is carried out by establishing a task-coverage repository. Each member of the repository is directed to respective tasks that are carried out by the design. The method is further carried out by determining probabilities of covering respective tasks by the members on the design, and responsively to the probabilities, automatically selecting a subset of the repository to define an optimized regression suite. The repository can include tests to be performed on the design.

According to another aspect of the method, the repository includes a plurality of instances of the tests, each of the instances having different parameters.

According to a further aspect of the method, the repository includes test specifications.

According to another aspect of the method, the optimized regression suite provides predetermined coverage of the tasks, and the subset of the repository has a minimal number of members.

One aspect of the method selecting a subset of the repository includes assigning an activation policy to elements of the subset of the repository.

In an additional aspect of the method, the subset of the repository is selected using a greedy algorithm.

According to still another aspect of the method, the subset of the repository is selected by relaxing a predetermined constraint.

Yet another aspect of the method includes establishing a task-coverage repository and probabilities are determined using coverage-directed test generation.

The invention also provides a computer software product, including a computer-readable medium in which computer program instructions are stored, which instructions, when read by a computer, cause the computer to perform a method for verifying a design, which is carried out by establishing a task-coverage repository. Each member of the repository is directed to respective tasks that are carried out by the design. The method is further carried out by determining probabilities of covering respective tasks by the members on the design, and responsively to the probabilities, automatically selecting a subset of the repository to define an optimized regression suite. The repository can include tests to be performed on the design.

The invention also provides a design verification system, including a memory having stored therein a description of identified tasks that are performed by a design and a task-coverage repository. Each member of the repository is directed to respective tasks. The system includes a processor operative to determine probabilities of covering the respective tasks on the design by the members and responsively to the probabilities, selecting a subset of the repository to define an optimized regression suite.

The invention also provides a method for verifying a design, which is carried out by identifying tasks that are performed by the design, establishing a task-coverage repository. Each member of the repository is directed to respective tasks. The method is further carried out by executing each of the members of the repository on the design, and responsively thereto, determining probabilities of covering the respective tasks by the members. Responsively to the probabilities, the method includes automatically selecting a subset of the repository to define an optimized regression suite, and executing the optimized regression suite on the design for verification thereof.

The invention further provides a computer software product, including a computer-readable medium in which computer program instructions are stored, which instructions, when read by a computer, cause the computer to perform a method for verifying a design, which is carried out by accepting a list of tasks that are performed by the design, establishing a task-coverage repository. Each member of the repository is directed to respective tasks. The method is further carried out by executing each of the members of the repository on the design, and responsively thereto, determining probabilities of covering the respective tasks by the members. Responsively to the probabilities, The method is further carried out by automatically selecting a subset of the repository to define an optimized regression suite for execution on the design for verification thereof.

The invention also provides a design verification system, including a memory having stored therein a description of identified tasks that are performed by a design and a task-coverage repository. Each member of the repository is directed to respective tasks. A processor has a test generator program for generating tests in accordance with the members and an execution engine for executing the tests on the design. The processor is operative responsively to the execution engine to determine probabilities of covering the respective tasks by the members and responsively to the probabilities, to select a subset of the repository to define an optimized regression suite.

Advantages afforded by the invention include improved environment coverage, and improved detection of design flaws as the development cycle progresses. Further advantages include a reduction in the cost of the design verification process, and optimization of design verification across many environments. The approach reduces the amount of testing by up to 90% when compared with the repetitive execution of all tests in all environments.

In the following description, numerous specific details are set forth in order to provide a thorough understanding of the present invention. It will be apparent to one skilled in the art, however, that the present invention may be practiced without these specific details. In other instances, well-known circuits, control logic, and the details of computer program instructions for conventional algorithms and processes have not been shown in detail in order not to obscure the present invention.

Software programming code, which embodies aspects of the present invention, is typically maintained in permanent storage, such as a computer readable medium. In a client-server environment, such software programming code may be stored on a client or a server. The software programming code may be embodied on any of a variety of known media for use with a data processing system. This includes, but is not limited to, magnetic and optical storage devices such as disk drives, magnetic tape, compact discs (CD's), and digital video discs (DVD's). In addition, while the invention may be embodied in computer software, the functions necessary to implement the invention may alternatively be embodied in part or in whole using hardware components such as application-specific integrated circuits or other hardware, or some combination of hardware components and software.

Architectural Overview.

Turning now to the drawings, reference is initially made to FIG. 1, which is a block diagram of a verification system that is operable in accordance with a disclosed embodiment of the invention. A generic verification system 10, used for verifying a software or hardware implementation of a design-under-test, has several basic interacting components. Those components of the verification system 10 that are located above a broken line 11 are dependent on the specification of the design-under-test, while those located below the line 11 are independent of the specification. The principles of the invention can be applied to many different verification systems and test generator engines.

The verification system 10 enables the creation of tests that have various degrees of randomness. The ability of the verification system 10 to introduce random unspecified values is fundamental, since design flaws in practice are usually unpredictable. However, the verification system 10 typically contains provisions for biasing the tests toward conditions of interest, for example boundary conditions, or specific byte alignments.

An optional abstract behavioral model 14 holds a formal description of the specification of the system. This specification may be stored in a database, which may also incorporate testing knowledge of the system design, including testing constraints and coverage criteria. The integration of all the information stored in the behavioral model 14 is referred to herein as the knowledge base of the verification system 10. The principles of the invention can also be applied in verification systems that are not model based, and that lack the behavioral model 14.

A generic test generator engine 22 has a user input 20, which influences the test generator engine 22. The influence of the input 20 includes, for example, the identity of the test instructions, their relative order, and various events relating to the instructions.

An optional behavioral simulator 26 may be constructed by the test generator from the behavioral model 14 by the test generator engine 22. This construction can be performed "on-the-fly", or as a separate off-line procedure. In either case, the behavioral simulator 26 is transparent to the user. In embodiments in which the behavioral simulator 26 is present, it is used to develop the behavioral model 14, and to predict the results of instruction execution in accordance with the specification of the system being verified.

The test generator engine 22 may also receive some generic knowledge of the design specification, and can exploit this knowledge so as to generate sequences of instructions to form the test cases 30. The test cases 30 are executed by an execution engine 12 on an implementation of the system under test. The system can be a complex software implemented system, or a hardware simulator. Indeed, the system itself may be a simulator.

Execution of the test cases 30 produces a response 34 from the system. The response 34 is submitted to a validation engine 36, which has knowledge of the expected response, validates the response 34, and produces validation results 38. The validation engine 36 may analyze the coverage of the test cases 30.

Constructing a Probabilistic Regression Suite.

Continuing to refer to FIG. 1, the test generator engine 22 is adapted in accordance with the principles of the invention to produce fixed or random regression suites. In the case of random regression suites, specification files can be provided via the user input 20. Before it is executed, the coverage properties of a given regression suite are probabilistically known. There are many possible ways to measure the coverage quality of a given test suite. One metric is the average number of tasks covered by the suite. This is simply the sum of the probabilities of covering each coverage task. Another measure is the smallest coverage probability of all tasks taken together. Maximizing this probability allows the regression suite to focus on the harder regions to cover, and in turn ensures that all the areas in the design are covered by the regression suite.

In general, the optimization problems as applied to random regression suites are hard to solve. Essentially, they are non-linear integer programming problems, some of which are constructed using many constraints. Methods are provided herein to ease the computation burden by linear relaxation, well known approximation techniques, and by greedy procedures. Alternatively, other standard optimization techniques may also be used to solve the optimization problems. Optimization may be formulated as a "soft" problem, which permits controlled violations of some of the constraints, while keeping the computation burden tolerable. For example, when the goal is to cover each task with a predefined probability, using as few tests as possible, it is often beneficial to allow some tasks to have a lower probability of being covered. This approach can significantly reduce the number of required tests.

Suppose, for example, one has conducted extensive simulations with many different parameter sets or sets of test specifications, obtained satisfactory coverage, and would like to maintain only the sets of parameters that are most important. That is, from a large task-coverage repository, which can consist of test cases, parameter sets or test specifications, it is desired to select a subset, which is as small as possible, yet is capable of producing coverage comparable to that previously obtained. The use of the same set of parameters several times is allowed, so in a sense the intent is not just to find an efficient and reliable test selection technique, but also to relate test selection with an activation policy that will specify how many times to execute the tests on the design-under-test. The activation policy operates by activating simulations or runs, using each of the selected parameter sets. Obviously, it is desirable to minimize the total number of executions on the design-under-test, while achieving a similar coverage percentage.

Notation.

The following terminology and notation are used herein:

Denote $t=\{t_1, \ldots, t_n\}$ as a set of tasks to be covered.

Denote $s=\{s_1, \ldots, s_k\}$ as sets of parameters that are allowed to be used in runs, either as simulations or directly executable as a test run on the design-under-test. There is one set per simulation or run, i.e., no switching of sets or mixing of individual parameters is allowed.

Denote $P_j^i$ as the probability of covering task $t_j$ in a simulation or run that uses parameter set (test specification) $s_i$. The probabilities $P_j^i$ are assumed to be statistically independent.

The inventors have learned that the above-noted statistics are reliable and justified by the motivating scenario for constructing a regression suite, based on data obtained by extensive simulations and, more accurately, many simulations per parameter set.

Denote $w=\{w_1, \ldots, w_k\}$ as an activation policy, such that $w_i \in N$ is an integer specifying how many times a simulation or run, using the parameter set $s_i$, must be activated. Also denote $W=\Sigma w_i$ as the total number of executions derived by using the policy w. According to the independence assumption, the order of activating the simulations or runs based on a given policy is insignificant, and in fact, they typically run in parallel.

Given a policy w, the probability of covering a task $t_j$ is represented by $$P_j = 1 - \prod_i (1 - P_j^i)^{w_i}. \quad (1)$$

Since the event of covering task $t_j$ is Bernoulli, $P_j = E(t_j)$ is the expected coverage of task $t_j$. The construction of a random regression suite can thus be expressed by the following optimization problem:

Probabilistic Regression Suite.

An aspect of the invention is to find the policy w, which minimizes the number of executions and has a high probability of providing a desired coverage. A specific coverage distribution is not necessarily targeted. However, by careful selection of a lower bound on a constraint, and with the addition of an upper bound, a desired coverage distribution can often be defined, provided that the optimization problem remains tractable. Such a policy may be formally defined as follows, wherein Ecnst is a predefined constraint:

Definition 1.

$$\min_w \sum_i w_i$$
$$s.t. \; \forall j \;\; P_j = 1 - \prod_i (1 - P_j^i)^{w_i} \geq Ecnst$$
$$\forall i \; N \ni w_i \geq 0$$

This is an integer programming (IP) problem, which is difficult to solve. However, when relaxation is applied to a linear programming (LP) problem, such as the IP problem stated in Definition 1, the obtained solution results in a "fractional" policy w, where the $w_i$ are real numbers. These real numbers must be discretized in order to construct the final policy.

By taking a log from both sides, the constraints in the problem statement Definition 1 can be re-written with linear constraints.

$$\sum_i w_i \cdot g_{ij} \leq \log(1 - Ecnst) \quad 2)$$

where $$g_{ij} = \log(1 - P_j^i).$$

The resulting optimization problem is linear:

Definition 2.

$$\min_w \sum_i w_i$$
$$s.t. \; \forall j \; \sum_i w_i \cdot g_{ij} \leq \log(1 + -Ecnst).$$
$$\forall i \; w_i \geq 0$$

To avoid numerical instability (when $P_j^i \to 1$), the following simple approximation is used:

$$\log(1-x) \approx \log(1+\epsilon-x) - \log(1+\epsilon) \approx \log(1+\epsilon-x) - \epsilon.$$

Soft Probabilistic Regression Suite.

Even using the relaxation techniques described so far, the previous optimization problem can be intractable, either because the feasibility region is empty, or some of the probabilities $P_j^i$ are too small. In such a case, the resulting policy specifies the use of many simulations in order to obtain acceptably complete coverage. These difficulties are handled with the introduction of a "soft" formulation, which permits some of the constraints to be violated. For each violated constraint the objective function is penalized by a quantity that is the violation magnitude multiplied by a cost C. This is done using additional set of non-negative slack variables, $xi \geq 0$, a function $$F_\alpha = \sum_i \xi_i^\alpha \quad (3)$$

with a parameter $\alpha > 0$. In the current embodiment $\alpha = 1$. An additional cost parameter C controls the tradeoff between complexity (small policies) and accuracy (number of constraint violations). The resulting optimization problem is stated as follows: Find the policy w, which minimizes the number of executions and with high probability provides a coverage that permits violation of the lower bounds for task coverage. Formally, this problem can be stated as follows.

Definition 3:

$$\min_w \sum_i w_i + C \sum_j \xi_j$$
$$s.t. \; \forall j \; \sum_i w_i \cdot g_{ij} - \xi_j \leq \log(1 - Ecnst)$$
$$\forall i \; w_i \geq 0$$
$$\forall j \; \xi_j \geq 0$$

Thus, a task $t_j$, for which $\xi_j > 0$, is not guaranteed to have an expected coverage that meets the predefined constraint $E(t_j) \geq Ecnst$.

Constructing Probabilistic Regression Suites with Limited Resources.

A slightly different scenario is the requirement to construct the "best" possible regression suite, using a limited amount of resources. Resources are identified using simulations or runs. Hence, the term "limited resources" generally translates to an upper bound on the total number of simulations permitted, e.g., due to a limitation of the batch scheduler. However, resources may translate to other measurable quantities related, for example, to the length of a simulation or run (number of cycles), or to memory consumption. Moreover, the constraints for resource usage may be defined per parameter set, instead of being a global restriction on the total resource consumption.

Expected Coverage Probability with Limited Resources.

The meaning of the term "best" possible regression suite is typically dependent on the testing environment. For example, in some environments, the number of simulation or run cycles may be critical, while in other environments the cost of preemption of hardware resources may govern the constitution of the regression suite. The problem may be stated as follows: Given a bound on the total number of simulations permitted, W, and a bound on the cost of the resource consumption C, find the policy w, which maximizes the expected coverage probability. Formally, this problem can be stated as follows.

Definition 4.

$$\max_w \sum_j \left[ 1 - \prod_i (1 - P_j^i)^{w_i} \right]$$
$$\text{s.t.} \quad \sum_i w_i \leq W$$
$$\sum_i c_i w_i \leq C$$
$$\forall i \quad w_i \geq 0,$$

where $c_i$ is the cost of the overall resource consumption while using the parameter set $s_i$.

The above problem is nonlinear, and can be solved using standard optimization techniques, though the solution will probably be just an approximation to the true objective. However, an incremental greedy technique can be devised, exploiting the next simple observation:

$$\max_j \prod_i (1 - P_j^i)^{w_i} = \max_j (1 - P_j^k) \prod_i (1 - P_j^i)^{w_i^{old}} \quad (4)$$

where $w^{old}$ denotes the policy before the last increment, and $w^{old}$ and the parameter set k were selected for the increment, i.e., $w_k = w_k^{old} + 1$. The incremental greedy algorithm thus starts from an initial guess $w_0$, (either given by the user or set to all zeros). At each step, there is an incrementation of the $w_k$ that minimizes $$\sum_j \prod_i (1 - P_j^i)^{w_i}, \quad (5)$$

and thus maximizes the objective function.

Worst-Case Coverage with Limited Resources.

The next problem statement represents a different perspective of the quality of coverage attained with limited resources, which focuses on the least probable (or most difficult) tasks to cover. The problem is stated as follows: Given a bound on the total number of simulations, W, and a bound on the cost of the resource consumption C, find the policy w, which maximizes the probability of the least probable task to be covered. Formally, this problem can be stated as follows.

Definition 5.

$$\max_w \quad \min_j \left[ 1 - \prod_i (1 - P_j^i)^{w_i} \right]$$
$$\text{s.t.} \quad \sum_i w_i \leq W$$
$$\sum_i c_i w_i \leq C$$
$$\forall i \quad w_i \geq 0,$$

where $c_i$ is the cost of the overall resource consumption while using the parameter set $s_i$. This problem can be solved via incremental greedy techniques.

Operation.

Figure 2:
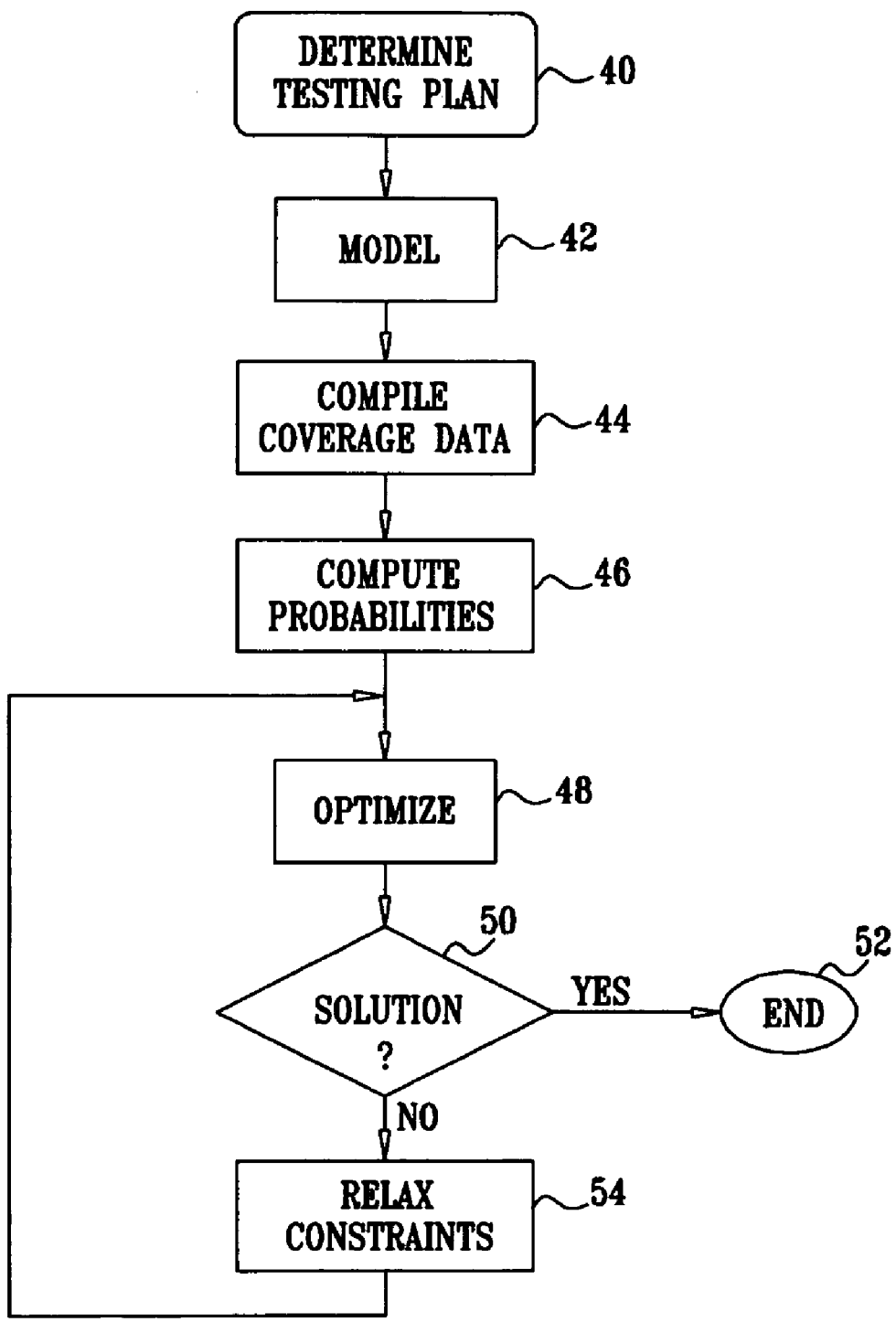
FIG. 2 is a flow chart illustrating a method of producing regression suites for verification of a design-under-test in accordance with a disclosed embodiment of the invention.

Reference is now made to FIG. 2, which is a flow chart illustrating a method of producing regression suites for verification of a design-under-test in accordance with a disclosed embodiment of the invention. At initial step 40 a testing strategy is defined for the design-under-test, the details of which are highly application dependent. For example, different tests could be scheduled to run on particular environments or machines. Machines could also be rotated, so that at least some of the tests are repeated in different environments and in different configurations of the machines.

Next, at step 42 a model of the design-under-test is prepared by known methods, suitable for automated processing by a test generator. This can be done, for example, by creating spreadsheet files, which can then be parsed and processed by the test generator. Information such as testing environments, responsibilities, and regression cycles are typically included in the files. In some applications the modeling techniques disclosed in commonly assigned application Ser. No. 10/122,427 (Publication No. 20030196191), entitled "Recursive Use of Model-Based Test Generation for Middleware Validation", which is herein incorporated by reference, may be employed in step 42.

Next, at step 44 coverage tasks are enumerated, and coverage data for these tasks is accumulated based on a set of tests, which have previously been devised and run on the design-under-test, using different test parameters, and which are now candidates for inclusion in an optimized regression suite. In some embodiments, the coverage data may be based on tests that are generated randomly from a previously devised set of test specifications. In these embodiments, the test specifications become the candidates to be considered.

Next, at step 46, probabilities $P_j^i$ are computed for each of the tests and for different parameters or test specifications that were used in step 44. It will be recalled that each probability $P_j^i$ is the probability of covering a task $t_j$ in a simulation or run that uses a particular parameter set or test specification $s_i$. For each simulation or run, a probability distribution for each activation policy $w_i$, which is the probability that a task is covered, is determined using i activations for the simulation or run. An optimization problem is constructed based on the probabilities and their distribution, as described hereinabove.

Next, at step 48 the optimization problem is solved, which results in a set of simulations, which is a regression suite including an activation policy. The suite has been selected so as minimize or maximize an objective function, while maximizing task coverage. The objective function to be minimized may be the number of executions required, or some resource cost, or both, as explained above. Alternatively, the objective function to be maximized may be task coverage, with limits on cost of operation. Indeed, the figure of merit for the optimization may be both goal dependent and application dependent. The greedy algorithm described above is used to perform the optimization in the current embodiment. Alternatively, other known optimization techniques may be employed.

Next, at decision step 50, it is determined whether a practical solution was obtained in step 48. If the determination at decision step 50 is affirmative, then the procedure ends at final step 52.

If the determination at decision step 50 is negative, then control proceeds to step 54. As noted above, violations of limits that are imposed on the optimization can be tolerated, in order that the optimization remains tractable. The conditions for the optimization in step 48 are reset, to allow the constraints to be violated. In the current embodiment, a penalty is imposed for each constraint violation. Control returns to step 48 so that the optimization can be recomputed.

Experimental Results.

The feasibility and applicability of the formalisms for the construction of random regression suites described hereinabove have been demonstrated in several experiments in both hardware verification and software testing environments, using practical applications and coverage models.

Regression Suite for Hardware Verification with Minimal Number of Simulations.

The following experiments illustrate the construction of a random regression suite for hardware verification using a minimal number of simulations. The environment and coverage model that were used in the experiments are described in the document *Coverage-directed Test Generation for Functional Verification Using Bayesian Networks*, S. Fine and A. Ziv, in Proceedings of the 40th Design Automation Conference, pages 286-291, June 2003, which is herein incorporated by reference. Briefly, coverage-directed test generation (CDG) is a technique to automate the feedback from coverage analysis to test generation. The main goals of CDG are to improve the coverage progress rate, to assist in reaching uncovered tasks, and to provide many different ways to cover a given task. CDG involves modeling the relationship between the coverage information and the directives to the test generator using Bayesian networks.

A Bayesian network is a directed graph, whose nodes are random variables, and whose edges represent direct dependency between their sink and source nodes. Each node in the Bayesian network is associated with a set of parameters specifying its conditional probability given the state of its parents.

The CDG process is performed in two main steps. In the first step, a training set is used to learn the parameters of a Bayesian network that models the relationship between the coverage information and the test directives. In the second step, the Bayesian network is used to provide the most probable directives that would lead to a given coverage task or set of tasks.

The random nature of automatic test-case generators imposes a considerable amount of uncertainty in the relationship between test directives and coverage tasks, e.g., the same set of directives can be used to generate many different test-cases, each leading to different coverage tasks. This inherent uncertainty suggests casting the CDG process in a statistical inference framework. To this end, Bayesian networks offer an efficient modeling scheme by providing a compact representation of the complex, possibly stochastic relationships among the CDG ingredients, together with the possibility of encoding essential domain knowledge.

Figure 3:
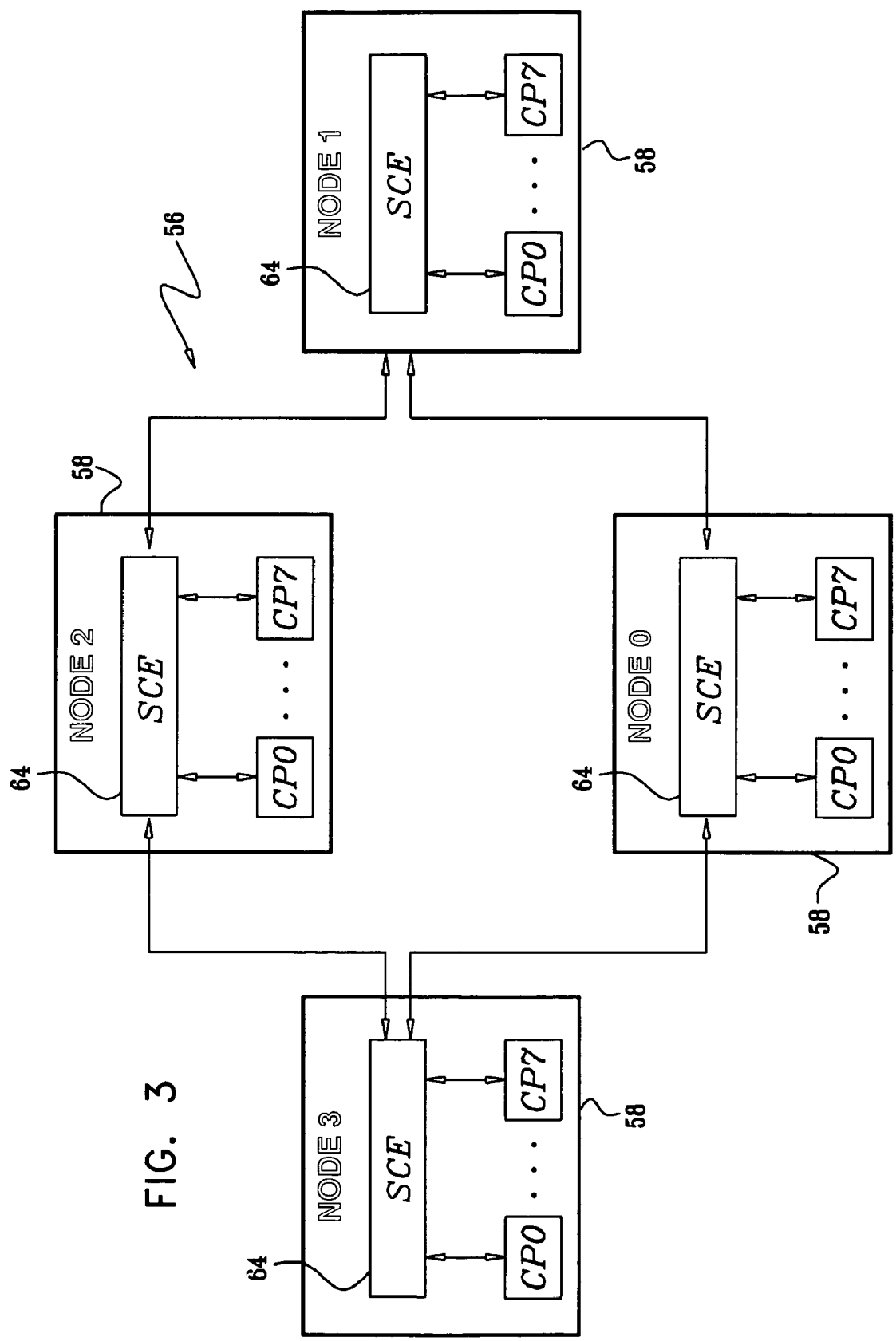
FIG. 3 is a block diagram of a portion of an exemplary design-under-test, which illustrates an application of a disclosed embodiment of the invention.

Reference is now made to FIG. 3, which is a block diagram of a portion of an IBM z-series™ system 56, which is the design-under-test of the experiments in accordance with a disclosed embodiment of the invention. The experiments were conducted on subsets of a coverage model used in the verification of a storage control element (SCE), which is a component of the system 56. The experimental environment contains four nodes 58 that are connected in a ring.

Figure 4:
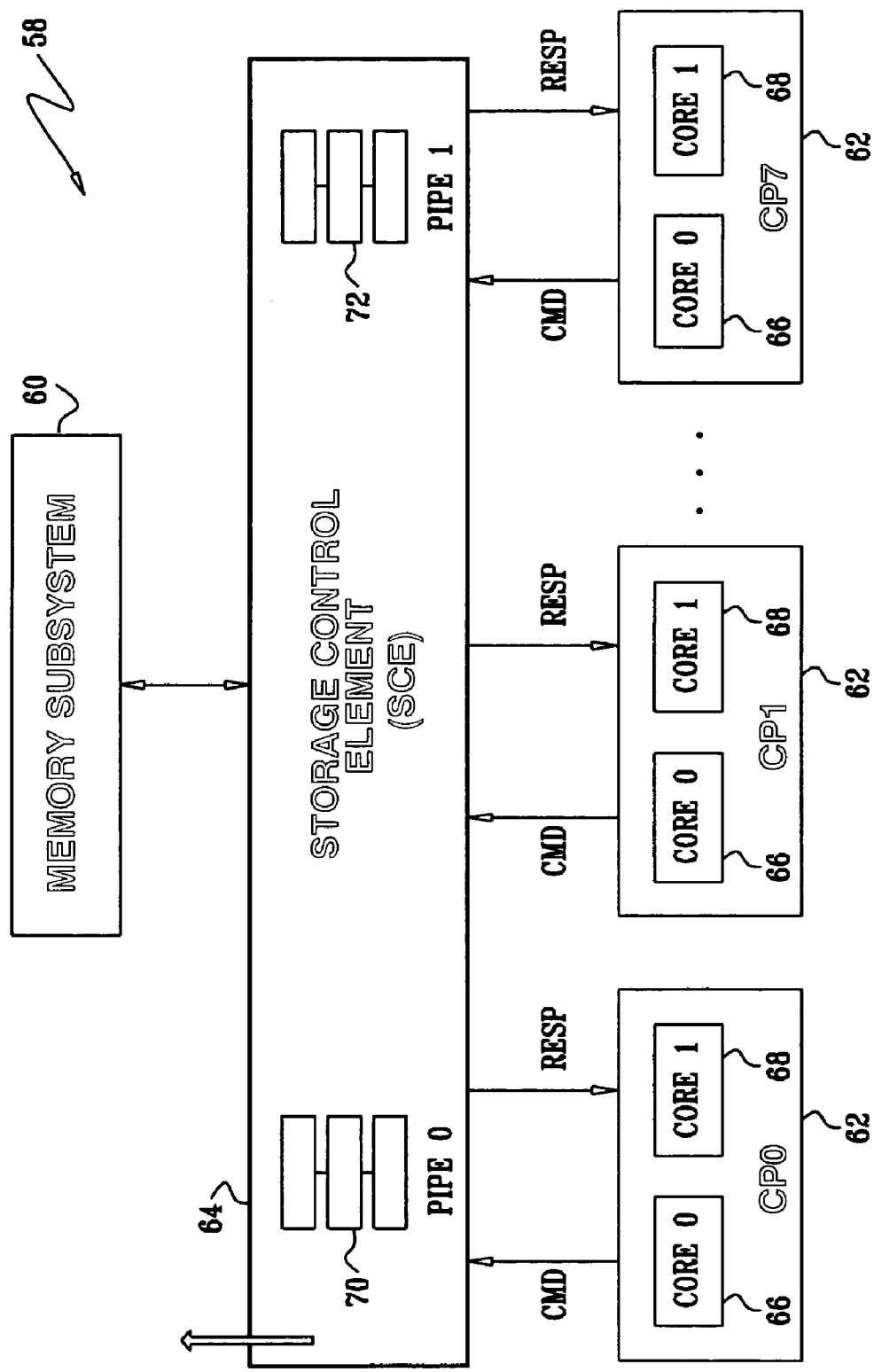
FIG. 4 is a detailed block diagram illustrating a node of the design-under-test shown in FIG. 3.

Reference is now made to FIG. 4, which is a block diagram illustrating one of the nodes 58 (FIG. 3) in further detail. Each of the nodes 58 is comprised of a memory subsystem 60, eight CPU's 62, and a SCE 64 that handles commands from the CPU's 62. Each CPU consists of two cores 66, 68 that independently generate commands to the SCE 64. The SCE 64 handles incoming commands using two internal pipelines 70, 72. When the SCE 64 finishes handling a command, it sends a response to the CPU that generated that command.

The coverage model consists of all the possible transactions between the CPU's 62 and the SCE 64. It contains six attributes: the core that initiated the command, the pipeline in the SCE 64 that handled it, the command itself, and three attributes that relate to the response.

EXAMPLE 1

The first experiment concerns a subset of the coverage model that deals with unrecoverable errors (UE). The size of the UE space is 98 events, all of which are relatively hard to cover.

The goal was to construct a regression suite by selecting, from a task-coverage repository of test specifications designed to cover the UE space, a much smaller subset that produces a coverage comparable to exhaustive execution of the entire repository. The repository consisted of 98 sets of test specifications, each of which was designed to provide the best possible configuration covering one of the events. The inherent randomness in the test generation mechanism enables covering other events as well during a simulation.

The regression suite and activation policy were generated using the linear relaxation of the formalism depicted in Definition 1, using a lower bound of ½ for the expected coverage for each task. The resulting regression suite was constructed using only three parameter sets, and the activation policy specified only 14 simulations.

Figure 5:
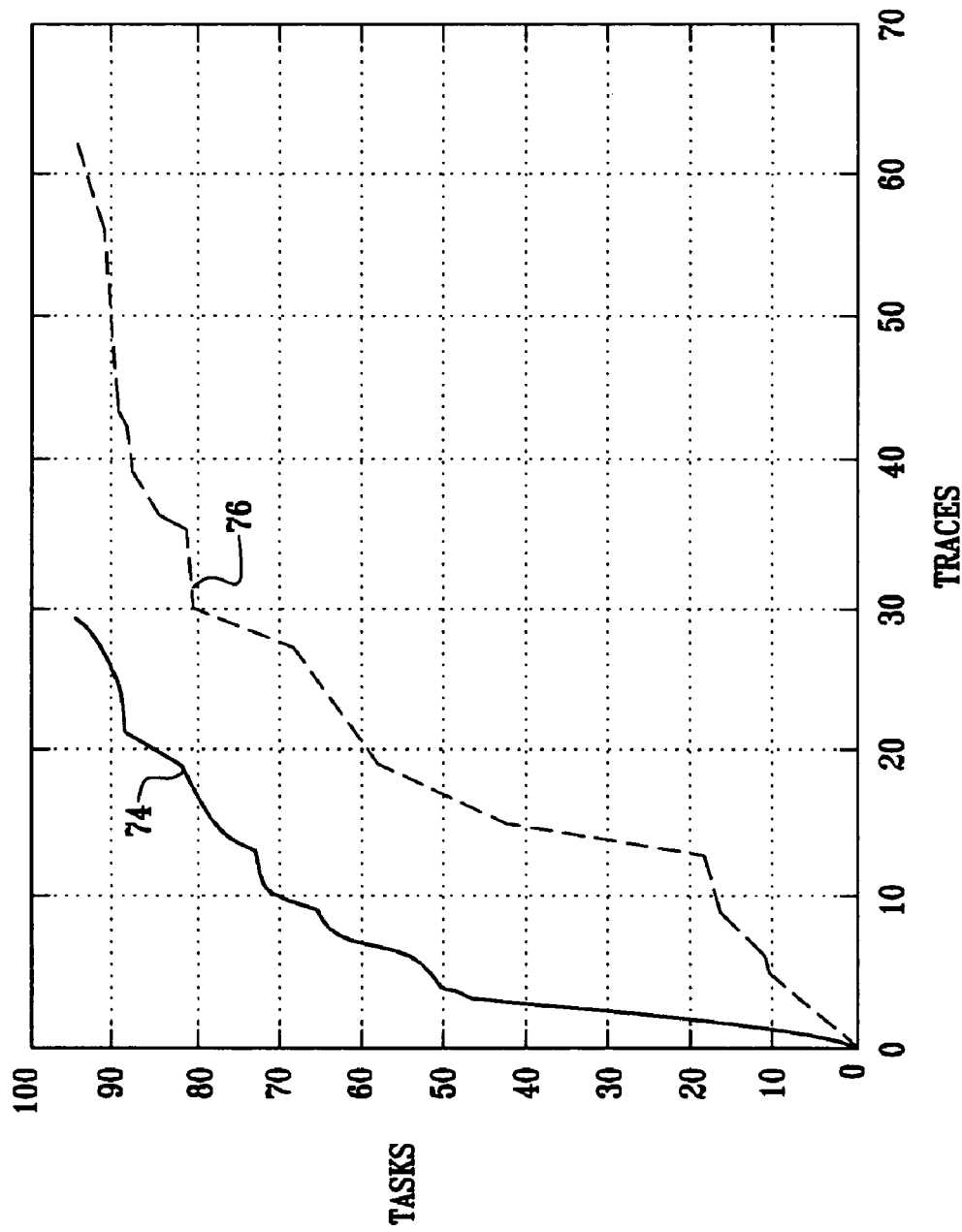
FIG. 5 is a plot illustrating the performance of a regression suite of the design-under-test shown in FIG. 3 in accordance with a disclosed embodiment of the invention.

Reference is now made to FIG. 5, which is a plot illustrating the coverage progress of the SCE model in accordance with a disclosed embodiment of the invention. The generated regression suite is indicated by a solid line 74. Approximately two rounds of the activating policy (29 simulations) suffice to cover 94 events (96%). This is compared with the conventional practice of activating each of the parameter sets in the repository, one at a time, indicated by a broken line 76. It took 61 simulations to achieve the same coverage using the conventional approach.

EXAMPLE 2

Figure 6:
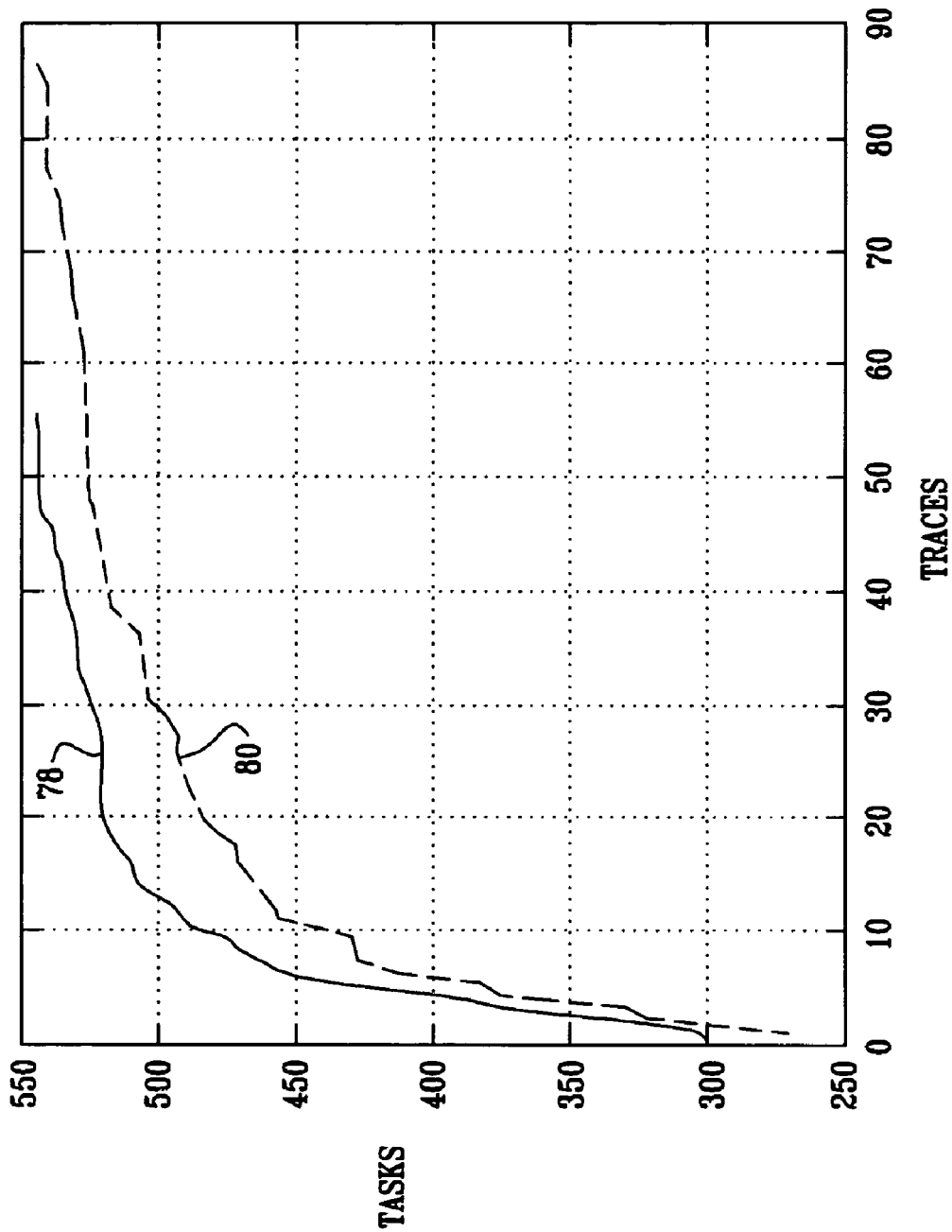
FIG. 6 is a plot illustrating the performance of a regression suite that is directed to tasks applicable to the design-under-test shown in FIG. 3 in accordance with a disclosed embodiment of the invention.

Reference is now made to FIG. 6, which is a plot illustrating a second experiment that targeted the entire SCE coverage model, which has 564 tasks, in accordance with a disclosed embodiment of the invention. Most of the tasks are not hard to cover. The repository consisted of 126 test specification, which were generated during a coverage-directed generation (CDG) process, which is described in the above-noted document, *Coverage-directed Test Generation for Functional Verification Using Bayesian Networks*. The regression suite and activating policy were generated using the soft probabilistic regression formalism depicted in Definition 3, using a lower bound of ½ for the expected coverage for each task. The resulting regression suite, indicated by a solid line 78, was constructed using 11 parameter sets, and the activation policy specified 32 simulations.

Indeed, as depicted in FIG. 6, after fewer than two rounds of the activating policy (55 simulations), 554 events (98%) were covered. This is compared with the activation of every parameter set in the task-coverage repository, one at a time, indicated by a broken line 80. It took 86 simulations to reach the same coverage using the latter method.

EXAMPLE 3

The following example is an application of the present invention in which a Java SDK was extensively tested on a variety of hardware architectures, national languages, and operating systems. Test cycles lasting about 4 months involved tuning of parameters, such as heap sizes, garbage collection algorithms, the Java just-in-time compiler (JIT). The project also involved testing the SDK using dependent software, such as Web browsers, and various IBM products, e.g., WebSphere Application Server (WAS), DB/2, and Host-on-Demand.

The complexity of the project can be appreciated by the fact that there were more than 300 environments to install and test. Parameters needed to be tuned to execute over 70 test suites controlled by more than 10 testers in two remote geographic sites. Furthermore, it was desirable to give individual testers control of test machines on which to run their tests.

Analysis of defects found during the previous test cycles and in the field showed the following: About 60% of the defects were common to all environments. About 20% were specific to an operating system or hardware family. About 20% were only exposed in a unique environment, for example, a particular hardware architecture, national language version, or locale, operating system, or versions thereof. Still other bugs were uncovered only when tuned parameters had particular settings.

For convenience of execution, related test cases were grouped together into test suites. Each test suite was run repeatedly, and in different environments throughout the test cycle, so that regressions were detected, both as a result of the tests being executed in a new environment and as a result of fixes injected throughout the testing cycle. Such fixes were implemented in response to defects fond by the test teams and the addition of new functions. As explained above, the number of environments in terms of operating system versions, national languages and hardware configurations, which Java claims to support, creates a much larger test space than the test team could exhaustively evaluate in all those environments.

To enable this strategy, the following methodology was employed. The test machines were classified into multiple partitions. The operating system versions to be tested were divided among the partitions. All machines had at least one English language partition. Test execution was divided into a convenient number of phases. The test suites were grouped together. The tests in the same group were scheduled to execute on the same set of machines at the same point in time. Thus, it was important to avoid potential conflicts. The simplest strategy was to group together all tests owned by the same tester. Another approach was to group together tests, which are manual and those that are completely automated in order to make the best use of machine time. The test machines were allocated among test suite groupings. Non-stress tests were allocated to test machines on a phase-by-phase basis, such that different machines were allocated to different test areas in each phase.

Probabilistic regression suites were generated, so as to minimize the number of executions, while maintaining a high probability of providing a desired coverage, as indicated by the defect analysis. This was accomplished by combinatorially matching test suites to particular test environments. The probabilistic regression suites were built up by performing this operation repeatedly, varying the mix of test suites and test environments over the planned test time period, which together defined the resource constraints. For example, the test suites were generated subject to a constraint that all tests were run in at least one environment in each phase, and at least one suite of tests was run in each environment.

Reference is now made to FIG. 7, which is a table illustrating the principle of the phasing and scheduling aspects of the project. In order to manage the project, an execution strategy was devised, which involved repetitive testing in 4 phases, each being 2 to 4 weeks in duration. During each phase, different tests were scheduled to run in different environments in different groups of machines. At the end of a phase, machines were rotated, such that the tests were repeated in new environments, taking into consideration that not all tests were applicable to all environments. It should be noted that the actual numbers of test suites and environments were far greater than used in this simple example.

It may be noted that scheduling was affected by lag time in generating the regression suites, difficulties in verifying the various environments at remote sites, and such issues as dependencies on hardware and software deliveries and updates. Therefore, it was deemed necessary to generate the schedules shown in FIG. 7 as late as possible.

Reference is now made to FIG. 8, which is a table showing aspects of a model of the testing project as entered into a spreadsheet, indicating various tests, testing environments, and test ownership, in accordance with a disclosed embodiment of the invention. The meanings of the columns of the table are as follows:

Platform: The product version under test.

Machine name: The IP name of the machine.

Partition: This is an arbitrary name used to uniquely identify a machine partition with a bootable operating system.

Installed OS: The operating system installed on the partition. It was sometimes necessary to use different names for the same operating system on different platforms if they needed to be treated differently. For instance, a test may not be applicable to the 64-bit versions of the operating systems, and the test exclusion mechanism (see below) would required these the 64-bit version to be differentiated from 32-bit versions, for example.

Installed National Language: This column was used for operating systems, which have versions specific to a particular national language, e.g., Microsoft Windows™. The language actually installed is entered. Unix-like operating systems typically just use the attribute 'locale' to switch between one national language and another.

Use for allocating tests: If 'N' was entered into this column, no tests were generated to run on this partition. For example, this option was used if a new Java release no longer supported a particular Linux distribution.

The following figures are representative samples of generated probabilistic regression suites after a detailed schedule for execution of test suites was constructed.

Reference is now made to FIG. 9, which is a table illustrating a representative high level general test execution plan in accordance with a disclosed embodiment of the invention. In this instance, non-stress testing was performed under the Linux IA-32 platform.

Reference is now made to FIG. 10, which is a table illustrating a representative portion of a test execution plan for a particular operating system generated in accordance with a disclosed embodiment of the invention. In this instance, testing was performed on the Windows IA-32 platform.

Reference is now made to FIG. 11, which is a table illustrating a representative portion of a test suite execution plan in accordance with a disclosed embodiment of the invention. In this instance, benchmark non-stress testing was performed under the Linux PPC32 platform.

Reference is now made to FIG. 12, which is a table illustrating a representative portion of a test execution plan for a particular machine in accordance with a disclosed embodiment of the invention. In this instance, non-stress testing was performed on machine jsvt091 under the Linux PPC32 platform in phase 1.

During testing, defect distribution was used as a basis for test optimization. Tests were run repeatedly through the test cycle to insure that there were no regressions. Environments, both hardware and software configurations, in which the tests are executed, were varied over time, and efforts were made to assure that all environments were sufficiently covered. According to the principles of the invention, not all tests were executed in all environments. Therefore, it was clearly documented which tests were run in which environments and when.

Regression Suite for Software Testing with a Limited Number of Test Executions.

In many cases, the resources and time allocated for execution of a regression suite are limited. For example, a nightly regression suite typically cannot last more than six hours, during which only a limited number of tests can be executed. The following experiments examine the formalism described above for building a random regression suite while limiting the resources available for constructing the regression. A natural application for this formalism is software testing, e.g., in a multi-threaded domain, where a set of predefined test heuristics is used to provide coverage, while limiting the total number of test executions.

A test in the multi-threaded domain is a combination of inputs and interleaving, where interleaving is the relative order in which the threads were executed. Running the same inputs twice may result in different outcomes, either by design or due to race conditions that exist in the code. Reexecuting the same suite of tests may result in different tasks being executed. Therefore, a regression suite does not have the same meaning as in the sequential domain.

A tool, ConTest, described in the document *Multithreaded Java Program Test Generation*, O. Edelstein, E. Farchi, Y. N. G. Ratzaby, and S. Ur, IBM Systems Journal, 41 (3):111-125, 2002, which is herein incorporated by reference, was used in the experiments, and generated different interleavings for the purpose of revealing concurrent faults. ConTest takes a heuristic approach of seeding the program with various types of noise or delays in concurrently significant locations. At runtime, heuristic decisions, possibly coverage-based, are made regarding which type of delay in progression or noise to activate at each interleaving, e.g., system calls sleep( ), yield( ), or priority( ). ConTest dramatically increases the probability of finding typical concurrent faults in Java programs. The probability of observing these concurrent faults without the seeded delays or noise is very low.

The following experiments conformed to a typical ConTest user scenario. A functional test t was run repeatedly without human intervention against the program P under test until a coverage target was achieved. The benefit of ConTest can be appreciated by a comparison with conventional unit, function, and system testing, in which the test is executed only once, unless a fault is found. Load testing, i.e., testing the application under a real or simulated workload, would increase the likelihood of some interleaving that would be unlikely under-light load. However, load testing is not systematic. Furthermore, it is expensive, and usually can only be performed at the very end of the testing cycle.

Figure 13:
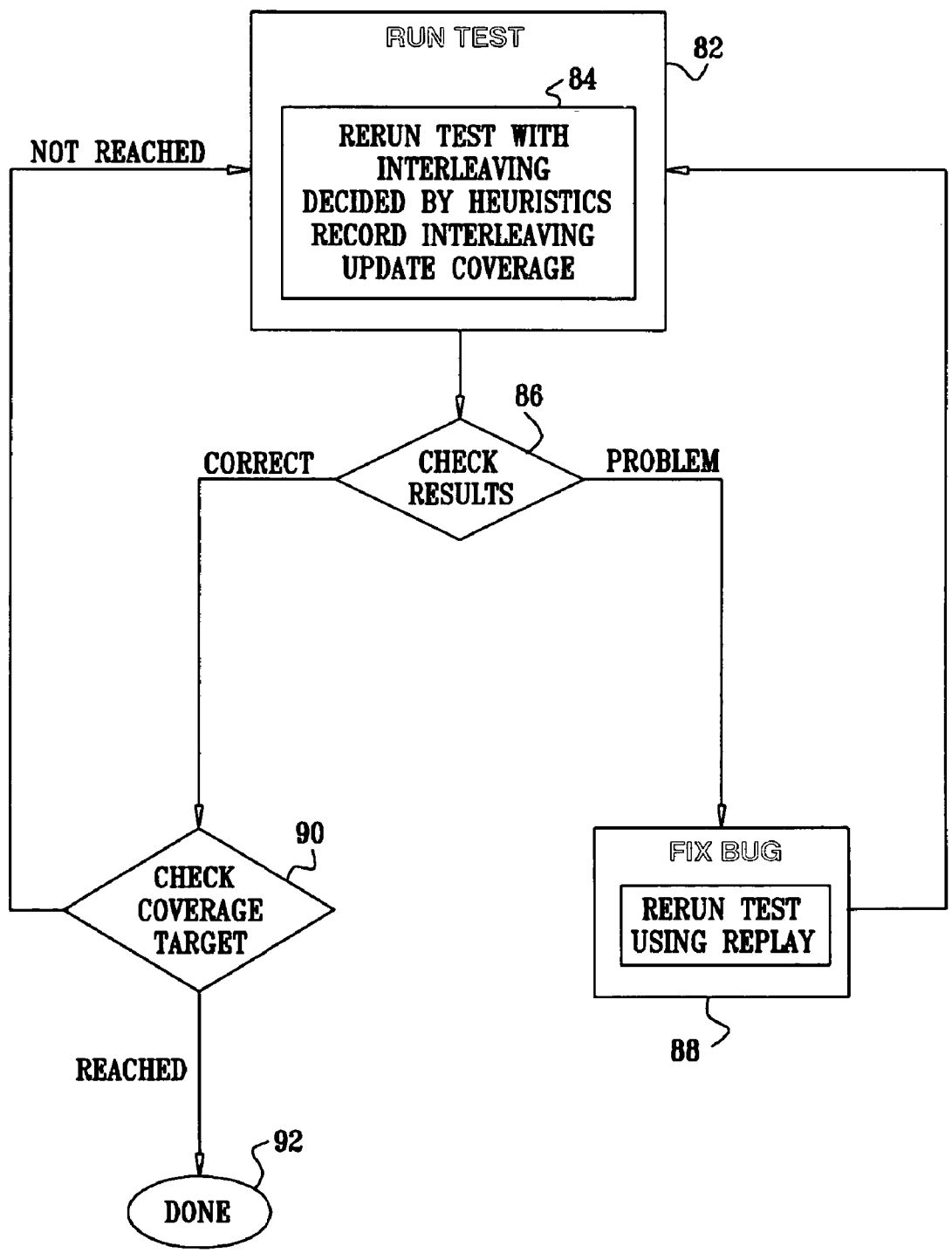
FIG. 13 is a flow diagram depicting a testing process using a tool for generating interleaving for the purpose of revealing concurrent faults in a design-under-test, in accordance with a disclosed embodiment of the invention.

Reference is now made to FIG. 13, which is a flow diagram depicting a testing process using the tool ConTest, in accordance with a disclosed embodiment of the invention. Each time the functional test t was run, ConTest produced a potentially different interleaving, as a result of the aforementioned seeding technique.

During the execution of the functional test t at block 82, coverage information was produced and collected in block 84. For example, as coverage information, one might note whether or not a context switch occurred while executing a program method. The test was then reexecuted with different heuristics, which might fail to produce a context switch, or might even produce a different context switch. Retrospective analysis of the test runs was performed at decision block 86. If a design flaw was revealed, then correction in the design was performed at block 88, and a replay mode of operation set. The test was then reexecuted in block 82.

If the analysis in decision block 86 revealed the test results to be correct, then at decision block 90 a determination was made whether the coverage target had been achieved. If not, then the test was reexecuted at block 82. Otherwise, the process terminated at block 92.

During the testing process statistics were collected, which were needed to construct probabilistic regression suites.

The tested program in the experiment was a crawling engine for a large web product. For the experiment, 13 different heuristics were used as the test specifications. The heuristics differed in the probability that noise is inserted at each instrumentation point and in the noise strength. For example, if the noise is introduced as the call yield( ), the number of times it is executed depends on the strength. Low strength means that the call yield( ) is executed just a few times and high strength means that it is executed many times. For the call sleep( ), a parameter influences the length of the sleep. Some heuristics had additional features, such as limiting the location of the noise to variables that are shared between threads or having additional types of noise primitives.

Given the statistics collected for the 13 heuristics, policies designed to maximize the coverage of 10,000 possible events were constructed, using no more than 250 test runs in one mode of operation, and no more than 1000 test runs in another mode of operation. To this end, the formalism depicted in Definition 4 was applied, while using the aforementioned greedy algorithm to obtain solutions. The policy that was designed to yield best coverage with only 250 test runs was constructed using only two of the 13 heuristics, while the policy for the 1000 test runs was constructed using four heuristics, two of which were very dominant in that they were used roughly 83% of the time.

TABLE 1

| | Num. Events Covered | |
|---|---|---|
| | 250 | 1000 |
| Uniform Policy | 1449 | 1988 |
| Best Pure Heuristic | 1699 | 2258 |
| Greedy Policy | 1723 | 2429 |

Table 1 presents the total number of events covered, when using 250 and 1000 test runs. The first row in the table presents represents a policy uniformly distributed over the 13 heuristics. The second row presents the coverage obtained by the best single heuristic. The last row presents the results of the policies generated by the greedy algorithm, which yields the best result. It may be noted in passing that by using every heuristic in 1000 test runs and combining the results, i.e., a total of 13,000 test runs, only 4338 events were found to be covered. Namely, 56.62% of the events are very hard to cover with this set of heuristics using such a limited number of test runs.

It will be appreciated by persons skilled in the art that the present invention is not limited to what has been particularly shown and described hereinabove. Rather, the scope of the present invention includes both combinations and subcombinations of the various features described hereinabove, as well as variations and modifications thereof that are not in the prior art, which would occur to persons skilled in the art upon reading the foregoing description.

Variations described for the present invention can be realized in any combination desirable for each particular application. Thus particular limitations, and/or embodiment enhancements described herein, which may have particular advantages to the particular application need not be used for all applications. Also, not all limitations need be implemented in methods, systems and/or apparatus including one or more concepts of the present invention.

The present invention can be realized in hardware, software, or a combination of hardware and software. A visualization tool according to the present invention can be realized in a centralized fashion in one computer system, or in a distributed fashion where different elements are spread across several interconnected computer systems. Any kind of computer system—or other apparatus adapted for carrying out the methods and/or functions described herein—is suitable. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context include any expression, in any language, code or notation, of a set of instructions intended to cause a system having an information processing capability to perform a particular function either directly or after conversion to another language, code or notation, and/or reproduction in a different material form.

Thus the invention includes an article of manufacture which comprises a computer usable medium having computer readable program code means embodied therein for causing a function described above. The computer readable program code means in the article of manufacture comprises computer readable program code means for causing a computer to effect the steps of a method of this invention. Similarly, the present invention may be implemented as a computer program product comprising a computer usable medium having computer readable program code means embodied therein for causing a function described above. The computer readable program code means in the computer program product comprising computer readable program code means for causing a computer to effect one or more functions of this invention. Furthermore, the present invention may be implemented as a program storage device readable by machine, tangibly embodying a program of instructions executable by the machine to perform method steps for causing one or more functions of this invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

The invention claimed is:

1. A method for testing a design, comprising the steps of:
in a verification system comprising a task coverage repository, a database, a test generator engine, an execution engine, and a validation engine;
using the task coverage repository for:
   enumerating coverage tasks for testing the design;
using a database for:
   storing a behavioral model of the design suitable for automated processing by a test generator engine; and
   storing a plurality of instances of tests and test parameters associated with the design, said test parameters associated with the coverage tasks;
using the test generator engine for:
   receiving as input a first set of test parameters from the database;
   defining a testing strategy by developing the behavioral model according to the test parameters using coverage-directed test generation;
   accumulating coverage data by running a set of tests on the design, using a first set of the test parameters, said set of tests being candidates for inclusion in an optimized regression suite; and
   receiving a second set of test parameters from the database, said second set different from the first set of test parameters;
   determining probabilities of covering respective ones of the coverage tasks, said determining step comprising:
   computing probabilities for each of the coverage tasks with the second set of test parameters, wherein each probability is a probability of covering the coverage tasks in a simulation that uses the second set of test parameters; wherein for each simulation there is determined a probability distribution for the probability that the tasks are covered; and
   constructing an optimization problem based on the computed probabilities and the distribution; and
using the execution engine for:
   automatically selecting a first subset of the sets of tests in the task-coverage repository to define an optimized regression suite, the step of automatically selecting comprising:
     selecting the first subset, resulting in a set of simulations which is a regression suite; and
   executing the first subset responsively to the optimization problem,
using a validation engine for:
   determining whether a solution to the optimization problem was obtained given a set of constraints;
   resetting conditions for the optimization problem by selecting a second subset of the set of tests to allow at least one of the constraints to be violated if no solution was obtained; and
   imposing a penalty for each constraint violation; and using the test generator for re-computing the optimization problem by running the second subset of the tests on the design.

2. The method according to claim 1, wherein storing the plurality of the instances of said tests, comprises storing each of said instances with different test parameters.

3. The method according to claim 1, wherein said optimized regression suite provides a predetermined coverage of said tasks and said subset of said repository has a minimal number of members.

4. The method according to claim 1, wherein said step of selecting a first subset of said repository comprises assigning the activation policy to elements of said sets of said repository.

5. The method according to claim 1, wherein said step of selecting a first subset of said repository is performed using a greedy algorithm.

6. The method according to claim 1, wherein selecting the first subset of the task coverage repository comprises relaxing a predetermined constraint.

7. The method according to claim 1, wherein establishing the task-coverage repository and determining probabilities are performed by coverage-directed test generation.

8. A computer software product, comprising a computer-readable medium in which computer program instructions are stored, which instructions cause the computer to perform a method for testing a design, comprising the steps of:

enumerating coverage tasks for testing the design;

storing a behavioral model of the design suitable for automated processing by a test generator engine;

storing a plurality of instances of tests and test parameters associated with the design, said test parameters associated with the coverage tasks;

receiving as input a first set of the test parameters;

defining a testing strategy by developing the behavioral model according to the first set of test parameters using coverage-based test generation;

accumulating coverage data by running a set of tests on the design, using the first set of the test parameters, said set of tests being candidates for inclusion in an optimized regression suite; and receiving a second set of test parameters different from the first set of test parameters;

determining probabilities of covering respective ones of the coverage tasks, said determining step comprising:

computing probabilities for each of the coverage tasks with the second set of test parameters, wherein each probability is a probability of covering the coverage tasks in a simulation that uses the second set of test parameters; wherein for each simulation covered a probability distribution for the probability that the coverage tasks are covered; and constructing an optimization problem based on the computed probabilities and the distribution; and automatically selecting a first subset of the sets of tests in the task-coverage repository to define an optimized regression suite, the step of automatically selecting comprising:

selecting the first subset, resulting in a set of simulations which is a regression suite; and executing the first subset responsive to the optimization problem;

determining whether a solution to the optimization problem was obtained given a set of constraints;

resetting conditions for the optimization problem by selecting a second subset to allow at least one of the constraints to be violated if no solution was obtained; and imposing a penalty for each constraint violation; and re-computing the optimization problem by running the second subset of the tests on the design.

9. The computer software product according to claim 8, wherein selecting the first subset of tests comprises relaxing a predetermined constraint.

10. The computer software product according to claim 8, comprising storing each of said instances with different test parameters.

11. The computer software product according to claim 8, wherein the optimized regression suite provides a predetermined coverage of the coverage tasks.

12. The computer software product according to claim 8, wherein the step of selecting the first subset of tests comprises assigning an activation policy to elements of the tests.

13. The computer software product according to claim 8, wherein the step of selecting the first subset of tests is performed using a greedy algorithm.

14. A design verification system, comprising:

a memory having stored therein:

a behavioral model of a design under test, said model being suitable for automated processing by a test generator;

a plurality of instances of tests and test parameters associated with the design, said test parameters associated with coverage tasks;

a task-coverage repository comprising the coverage tasks that are performed by the design and having members, each of said members being directed to respective ones of the coverage tasks;

a test generator operatively connected with the task-coverage repository, said test generator comprising a user input that influences the test generator;

the user input for receiving as input a first set of test parameters from the memory;

wherein the test generator is operable to enumerate the coverage tasks and accumulate coverage data for the coverage tasks based on a set of tests run on the design using the first set of test parameters, said set of tests being candidates for inclusion in an optimized regression suite;

a behavioral simulator used to:

receive a second set of test parameters from the memory, said second set different from the first set of test parameters;

develop the behavioral model according to the first set of test parameters using coverage-directed test generation;

predict results by determining probabilities of covering said respective ones of the coverage tasks on said design by said members, said behavioral simulator being operable to:

compute probabilities for each of the coverage tasks with the second set of test parameters, wherein each probability is a probability of covering the coverage tasks in a simulation that uses the second set of test parameters; wherein for each simulation a probability distribution for the probability that the coverage tasks are covered is determined and construct an optimization problem based on the computed probabilities and the distribution;

an execution engine operatively connected with the test generator, and wherein, responsive to said probabilities, selects a first subset of the tests to define an optimized regression suite, wherein the execution engine is operable to:
  select the first subset, resulting in a set of simulations which is a regression suite; and
  execute a first subset of the tests from memory and prepared by the test generator responsive to the optimization problem; and
a validation engine for validating an output of the execution engine and producing validation results, wherein the validation engine is operable to:
  determine whether a solution was obtained given a set of constraints;
  reset conditions for the optimization problem by selecting a second subset of tests from the memory to allow at least one of the constraints to be violated if no solution was obtained;
  impose a penalty for each constraint violation; and
  re-compute optimization by running the second subset of the tests on the design.

15. The design verification system according to claim 14, wherein the optimized regression suite provides a predetermined coverage of said tasks and the task-coverage repository comprises a minimal number of members 16. The design verification system according to claim 15, wherein selecting a subset of tests comprises assigning an activation policy to elements of the set of tests from the memory.

17. The design verification system according to claim 14, wherein the execution engine is adapted for selecting the first subset using a greedy algorithm.

18. The design verification system according to claim 14, wherein selecting the second subset comprises relaxing a predetermined constraint.

* * * * *